(12) United States Patent
Zhou et al.

(10) Patent No.: US 10,598,749 B2
(45) Date of Patent: Mar. 24, 2020

(54) RF SPOILING METHOD AND APPARATUS FOR RAPID SPATIAL SATURATION IN MAGNETIC RESONANCE IMAGING

(71) Applicant: Siemens Healthcare GmbH, Erlangen (DE)

(72) Inventors: Kun Zhou, Shenzhen (CN); Fang Dong, Shenzhen (CN); Nan Xiao, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 50 days.

(21) Appl. No.: 15/963,191

(22) Filed: Apr. 26, 2018

(65) Prior Publication Data

US 2018/0313924 A1    Nov. 1, 2018

(30) Foreign Application Priority Data

Apr. 26, 2017  (CN) .......................... 2017 1 0282305

(51) Int. Cl.
*G01R 33/483*   (2006.01)
*G01R 33/56*    (2006.01)
*G01R 33/565*   (2006.01)

(52) U.S. Cl.
CPC ..... *G01R 33/4838* (2013.01); *G01R 33/5608* (2013.01); *G01R 33/56545* (2013.01)

(58) Field of Classification Search
CPC .................. G01R 33/4838; G01R 33/5608
See application file for complete search history.

(56) References Cited

U.S. PATENT DOCUMENTS

| | | | |
|---|---|---|---|
| 5,500,593 A | 3/1996 | Loncar et al. | |
| 9,285,443 B2* | 3/2016 | He | G01R 33/1284 |
| 9,476,955 B2* | 10/2016 | Stemmer | G01R 33/543 |
| 9,664,760 B2* | 5/2017 | James | G01R 33/4818 |
| 9,733,326 B2* | 8/2017 | He | G01R 33/485 |
| 9,739,861 B2* | 8/2017 | Smith | G01R 33/56 |
| 10,061,003 B2* | 8/2018 | James | A61B 5/7203 |
| 10,330,763 B2* | 6/2019 | James | G01R 33/5619 |
| 2002/0165446 A1* | 11/2002 | Ryf | G01R 33/563 600/410 |
| 2007/0007959 A1* | 1/2007 | Szyperski | G01R 33/4616 324/307 |
| 2012/0274323 A1* | 11/2012 | He | G01R 33/1284 324/309 |

(Continued)

OTHER PUBLICATIONS

Bernstein, Matt A. et al. "Handbook of MRI Pulse Sequences" Elsevier, 2004.

*Primary Examiner* — Dixomara Vargas
(74) *Attorney, Agent, or Firm* — Schiff Hardin LLP

(57) ABSTRACT

In an RF spoiling method and apparatus for rapid spatial saturation in magnetic resonance imaging, a first RF pulse of a spatial saturation module is applied, and a first set of RF pulses of an imaging sequence is applied after the first RF pulse. A phase of an RF pulse, closest to the first RF pulse in the time dimension, in the first set of RF pulses is not coherent with a phase of the first RF pulse. This makes a phase cycle of the spatial saturation module and a phase cycle of the imaging sequence independent of each other, so the coherence of residual signals in the transverse plane can be destroyed more effectively, thereby reducing artefacts, and improving imaging quality.

10 Claims, 5 Drawing Sheets

(56) References Cited

U.S. PATENT DOCUMENTS

| | | | |
|---|---|---|---|
| 2013/0249548 A1* | 9/2013 | Stemmer | G01R 33/4835 324/309 |
| 2013/0278258 A1* | 10/2013 | Smith | G01R 33/56 324/309 |
| 2014/0218027 A1* | 8/2014 | Fautz | G01R 33/4836 324/309 |
| 2014/0296695 A1* | 10/2014 | He | G01R 33/485 600/410 |
| 2016/0154077 A1* | 6/2016 | He | G01R 33/1284 324/309 |
| 2017/0030986 A1* | 2/2017 | James | G01R 33/4818 |

* cited by examiner

RF SPOILING METHOD AND APPARATUS FOR RAPID SPATIAL SATURATION IN MAGNETIC RESONANCE IMAGING

BACKGROUND OF THE INVENTION

Field of the Invention

The present invention concerns magnetic resonance imaging, in particular an RF spoiling method and apparatus for rapid spatial saturation.

Description of the Prior Art

Magnetic resonance (MR) imaging is an imaging technology involving biomagnetics and nuclear spin, which has advanced rapidly with the development of computer technology, electronic circuit technology and superconductor technology. It uses an MR scanner in which a basic magnetic field and radio frequency (RF) pulses are produced, so as to induce oscillation of precessing hydrogen nuclei (i.e. H+) in human tissue, and thereby generate RF signals that are processed by a computer to form an image. If an object is placed in a magnetic field and irradiated by suitable electromagnetic waves to produce resonance therein, and electromagnetic waves that are thereby emitted are spatially encoded by activating gradient fields and are then evaluated to identify the positions and types of the atomic nuclei of which the object is composed. On this basis, a precise three-dimensional image of the interior of the object can be produced.

Spatial saturation is a commonly used technique in MR. This technique removes unwanted signals in order to suppress motion and flow artefacts in the image. The series of RF pulses and gradient fields that is used to operate the MR scanner in order to acquire MR data from an object is called an acquisition protocol or scan protocol. A spatial saturation module of such a protocol generally includes a spatially selective 90-degree RF pulse, a slice selection gradient and a dephasing gradient. The spatially selective 90-degree RF pulse acts together with the slice selection gradient, so as to flip the magnetization vector of selected nuclear spins at the position needing saturation, into the transverse plane. The dephasing gradient is then used to eliminate a signal in a saturation band, thereby preventing subsequent imaging from being affected. In an imaging sequence, one spatial saturation module may be applied before the acquisition of each echo or echo train; this method is referred to as a standard spatial saturation mode. In the case of certain rapid gradient echo sequences (such as the Fast Low Angle Shot Imaging (FLASH) sequence), a rapid spatial saturation mode will generally be used, i.e. one spatial saturation module is applied for multiple echoes or echo trains, thereby reducing the overall acquisition time.

RF spoiling rotates the phase of an RF pulse in a predetermined manner, and is an effective technique for eliminating residual spin coherence in the transverse plane. An RF spoiling method commonly used at present includes linearly increasing phase increments of two adjacent RF pulses of a spatial saturation module, such that the phase of an RF pulse of the spatial saturation module stays the same as an RF pulse phase of an imaging sequence.

However, such an RF spoiling method is suitable only for the standard spatial saturation mode. At present, there is a lack of corresponding research into RF spoiling technology in rapid spatial saturation modes.

SUMMARY OF THE INVENTION

An object of the present invention is to provide an RF spoiling method and MR apparatus for rapid spatial saturation, so as to improve imaging quality.

This object is achieved by an RF spoiling method for rapid spatial saturation in accordance with the invention, wherein a control computer of an MR apparatus generates and emits control signals to an MR scanner in order to operate the MR scanner by applying a first RF pulse of a spatial saturation module, and applying a first set of RF pulses of an imaging sequence after the first RF pulse, wherein a phase of an RF pulse, closest to the first RF pulse in the time dimension, in the first set of RF pulses is not coherent with a phase of the first RF pulse.

In an embodiment, the method also includes applying a second RF pulse of the spatial saturation module after the first set of RF pulses, and applying a second set of RF pulses of the imaging sequence after the second RF pulse, wherein a phase of an RF pulse, closest to the second RF pulse in the time dimension, in the second set of RF pulses is not coherent with a phase of the second RF pulse.

In another embodiment, the method also includes applying a third RF pulse of the spatial saturation module after the second set of RF pulses, and applying a third set of RF pulses of the imaging sequence after the third RF pulse, wherein a phase of an RF pulse, closest to the third RF pulse in the time dimension, in the third set of RF pulses is not coherent with a phase of the third RF pulse.

The invention also encompasses an RF spoiling method for rapid spatial saturation wherein the MR scanner is operated by applying multiple RF pulses of a spatial saturation module, and applying multiple RF pulses of an imaging sequence, between two adjacent RF pulses of the spatial saturation module, wherein a phase of each RF pulse of the spatial saturation module is not coherent with a phase of an RF pulse, closest to said RF pulse of the spatial saturation module in the time dimension, amongst the multiple RF pulses of the imaging sequence.

In an embodiment, a phase increase amount of two adjacent RF pulses of the spatial saturation module maintains linear increase, and a phase of an initial RF pulse of the spatial saturation module cannot divide exactly into 360 degrees.

In another embodiment, the phases of the multiple RF pulses of the spatial saturation module are $\varphi_j$: $\varphi_j = \frac{1}{2}\varphi_0(j^2+j+2)$, $j=0, 1, 2 \ldots$, wherein j are the respective order numbers of the multiple RF pulses; $\varphi_0$ is a phase of an initial RF pulse of the spatial saturation module.

In another embodiment, $\varphi_0$ is 117 degrees and a phase of an initial RF pulse of the imaging sequence is 50 degrees.

A magnetic resonance apparatus in accordance with the invention has a computer that operates a magnetic resonance data acquisition scanner in order to implement any or all embodiments of the method according to the invention, as described above.

In an embodiment, the phases of the multiple RF pulses of the spatial saturation module are $\varphi_j$: $\varphi_j = \frac{1}{2}\varphi_0(j^2+j+2)$, $j=0, 1, 2 \ldots$, wherein j are the respective order numbers of the multiple RF pulses; $\varphi_0$ is a phase of an initial RF pulse of the spatial saturation module.

As described above, in accordance with the present invention, a first RF pulse of a spatial saturation module is applied, and after the first RF pulse, a first set of RF pulses of an imaging sequence is applied, wherein a phase of an RF pulse, closest to the first RF pulse in the time dimension, in the first set of RF pulses is not coherent with a phase of the first RF pulse. Thus, in accordance with the present invention, by making a phase cycle of the spatial saturation module and a phase cycle of the imaging sequence independent of each other, the coherence of residual signals in the transverse plane is destroyed effectively, thereby reducing artefacts, and improving imaging quality.

Moreover, a phase increase amount of two adjacent RF pulses of the spatial saturation module in an embodiment of the present invention maintains linear increase, and uniform dispersion of residual signals in the transverse plane can be ensured, thereby preventing artefact accumulation.

Furthermore, embodiments of the present invention do not require changes to hardware structure, and so are convenient to implement.

DESCRIPTION OF THE PREFERRED EMBODIMENTS

The present invention is described in detail below in conjunction with the accompanying drawings and embodiments, to explain the technical solution and advantages thereof. It should be understood that the particular embodiments described herein are only intended to explain the basis of the present invention.

In a standard spatial saturation mode, each RF pulse of an imaging sequence corresponds to each RF pulse of a spatial saturation module respectively, i.e. there is a one-to-one correspondence between the RF pulses of the imaging sequence and the RF pulses of the spatial saturation module. Moreover, the phase of each RF pulse of the imaging sequence is kept the same as the phase of the corresponding RF pulse of the spatial saturation module, thereby realizing RF spoiling.

In a rapid spatial saturation mode, multiple RF pulses of an imaging sequence correspond to one RF pulse of a spatial saturation module, and the phases of these multiple RF pulses of the imaging sequence are not equal. Thus, it is not possible to keep the phase of the RF pulse of the spatial saturation module the same as the phases of the corresponding multiple RF pulses of the imaging sequence in order to realize RF spoiling.

At present, common practice used by those skilled in the art when dealing with RF spoiling in a rapid spatial saturation mode is as follows. The phase of an RF pulse (assumed to be an RF pulse A) of a spatial saturation module is kept the same as the phase of that RF pulse, amongst the corresponding multiple RF pulses of the imaging sequence, which is closest to the RF pulse A in the time dimension. After much testing, the applicant has discovered that such a processing method is unable to effectively eliminate coherence of residual signals in the transverse plane, and hence might give rise to artefacts. Furthermore, the applicant has also discovered the following after much testing: after making a phase cycle of a spatial saturation module and a phase cycle of an imaging sequence independent of each other, the coherence of residual signals in the transverse plane can be effectively destroyed, thereby reducing artefacts.

Figure 1:
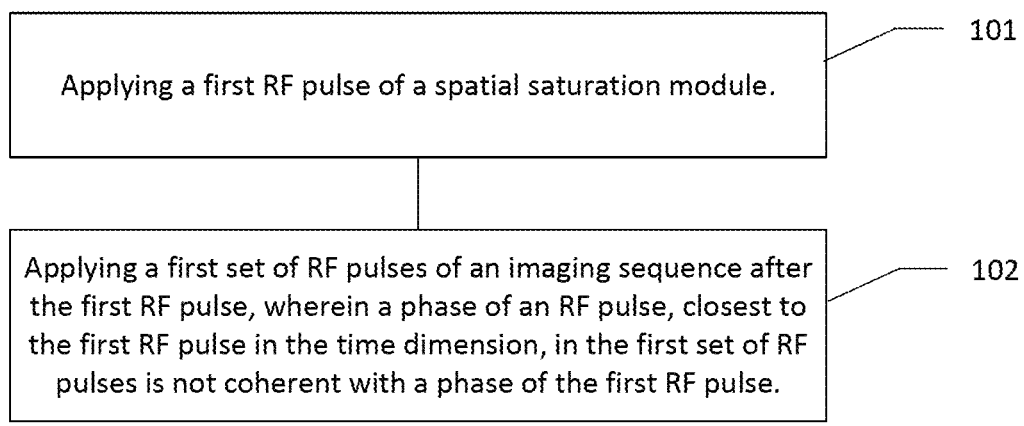
FIG. 1 is a flowchart of a first embodiment of an RF spoiling method for rapid spatial saturation according to the present invention.

FIG. 1 is a flowchart of an RF spoiling method for rapid spatial saturation according to an embodiment of the present invention.

As FIG. 1 shows, the method includes operating an MR scanner with control signals as follows:

Step 101: applying a first RF pulse of a spatial saturation module.

Here, the first RF pulse of the spatial saturation module is applied to a region to be saturated. The region to be saturated may be moving or flowing tissue.

Step 102: applying a first set of RF pulses of an imaging sequence after the first RF pulse, wherein a phase of an RF pulse, closest to the first RF pulse in the time dimension, in the first set of RF pulses is not coherent with a phase of the first RF pulse.

Here, the first set of RF pulses of the imaging sequence is applied to an imaging region after the first RF pulse. The imaging region may coincide with the region to be saturated, or may be independent of the region to be saturated. The first set of RF pulses comprises multiple RF pulses. Moreover, the phase of that RF pulse, amongst the multiple RF pulses, which is closest to the first RF pulse in the time dimension is not coherent with the phase of the first RF pulse, wherein the specific meaning of phase incoherence is that the phases are not equal.

In this embodiment of the present invention, the phase of the first RF pulse of the spatial saturation module is kept independent of the phase of a first RF pulse in the corresponding imaging sequence RF pulse set (i.e. the first set of RF pulses), hence the coherence of residual signals acquired by a first phase cycle of the imaging sequence in the transverse plane can be effectively destroyed.

In another embodiment, the method also includes:

applying a second RF pulse of the spatial saturation module after the first set of RF pulses; applying a second set of RF pulses of the imaging sequence after the second RF pulse; wherein a phase of an RF pulse, closest to the second RF pulse in the time dimension, in the second set of RF pulses is not coherent with a phase of the second RF pulse.

Similarly, in this embodiment of the present invention, the phase of the second RF pulse of the spatial saturation module is kept independent of the phase of a first RF pulse in the corresponding imaging sequence RF pulse set (i.e. the second set of RF pulses), hence the coherence of residual signals acquired by a second phase cycle of the imaging sequence in the transverse plane can be effectively destroyed.

In another embodiment, the method also includes:

applying a third RF pulse of the spatial saturation module after the second set of RF pulses; applying a third set of RF pulses of the imaging sequence after the third RF pulse; wherein a phase of an RF pulse, closest to the third RF pulse in the time dimension, in the third set of RF pulses is not coherent with a phase of the third RF pulse.

Similarly, in this embodiment of the present invention, the phase of the third RF pulse of the spatial saturation module is kept independent of the phase of a first RF pulse in the corresponding imaging sequence RF pulse set (i.e. the third set of RF pulses), hence the coherence of residual signals acquired by a third phase cycle of the imaging sequence in the transverse plane can be effectively destroyed.

Preferably, after a third phase cycle of the spatial saturation module and the third phase cycle of the imaging sequence, a subsequent phase cycle of the spatial saturation module is still kept independent of a subsequent phase cycle of the imaging sequence. Specifically, the method also comprises: applying a subsequent RF pulse of the spatial saturation module; applying a subsequent set of RF pulses of the imaging sequence after the subsequent RF pulse, wherein a phase of an RF pulse, closest to the subsequent RF pulse in the time dimension, in the subsequent set of RF pulses is not coherent with a phase of the subsequent RF pulse.

Hence, in this embodiment of the present invention, a subsequent phase cycle of the spatial saturation module is still kept independent of a subsequent phase cycle of the imaging sequence, and the coherence of residual signals acquired by the subsequent phase cycle of the imaging sequence in the transverse plane can likewise be effectively destroyed.

As an example, the imaging sequence may specifically be implemented as a rapid gradient echo sequence, such as a FLASH sequence or a Volume Interpolated Body Examination (VIBE) sequence.

Particular embodiments of imaging sequences have been listed in detail above, but those skilled in the art will realize that such a listing is not limiting, and is not intended to constitute a restriction on the scope of protection of embodiments of the present invention.

In one embodiment, a phase increase amount of two adjacent RF pulses of the spatial saturation module maintains linear increase, and a phase of an initial RF pulse of the spatial saturation module cannot divide exactly into 360 degrees, thereby ensuring uniform dispersion of residual signals in the transverse plane.

As an example, the phases of multiple RF pulses of the spatial saturation module are $\varphi_j$: $\varphi_j = \frac{1}{2}\varphi_0(j^2+j+2)$, $j=0, 1, 2 \ldots$, wherein j are the respective order numbers of the multiple RF pulses; $\varphi_0$ is the phase of the initial RF pulse of the spatial saturation module.

In this case, the phase of a first RF pulse is $\varphi_0$; the phase of a second RF pulse is $2\varphi_0$; and the phase of a third RF pulse is $4\varphi_0$, wherein $\varphi_0$ cannot divide exactly into 360 degrees, i.e. $\varphi_0$ cannot be 2 degrees, 3 degrees, 4 degrees, 5 degrees, 6 degrees, 8 degrees . . . , etc.

Preferably, the applicant has also discovered the following after much testing: when $\varphi_0$ is 117 degrees, and the phase of an initial RF pulse of the imaging sequence is 50 degrees, the coherence of residual signals in the transverse plane can be significantly destroyed.

Based on the description above, another embodiment of the present invention also involves an RF spoiling method for rapid spatial saturation.

Figure 2:
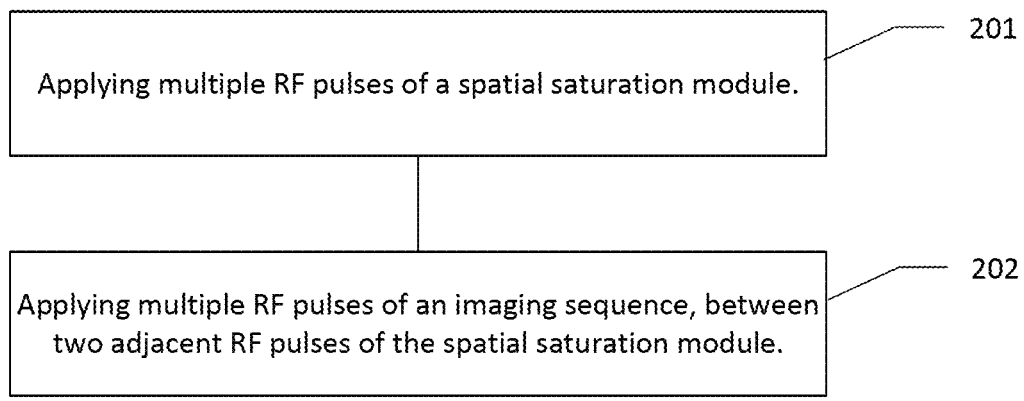
FIG. 2 is a flowchart of a second embodiment of an RF spoiling method for rapid spatial saturation according to the present invention.

FIG. 2 is a flowchart of an RF spoiling method for rapid spatial saturation according to this further embodiment of the present invention.

As FIG. 2 shows, the method includes:

Step 201: applying multiple RF pulses of a spatial saturation module.

Step 202: applying multiple RF pulses of an imaging sequence, between two adjacent RF pulses of the spatial saturation module. A phase of each RF pulse of the spatial saturation module is not coherent with a phase of an RF pulse, closest to said RF pulse of the spatial saturation module in the time dimension, amongst the multiple RF pulses of the imaging sequence.

In one embodiment, the phases of the multiple RF pulses of the spatial saturation module are $\varphi_j$: $\varphi_j = \frac{1}{2}\varphi_0(j^2+j+2)$, $j=0, 1, 2 \ldots$, wherein j are the respective order numbers of the multiple RF pulses; $\varphi_0$ is a phase of an initial RF pulse of the spatial saturation module.

RF spoiling in rapid spatial saturation in an embodiment of the present invention is explained by way of example below, taking a FLASH sequence as an example.

Figure 3:
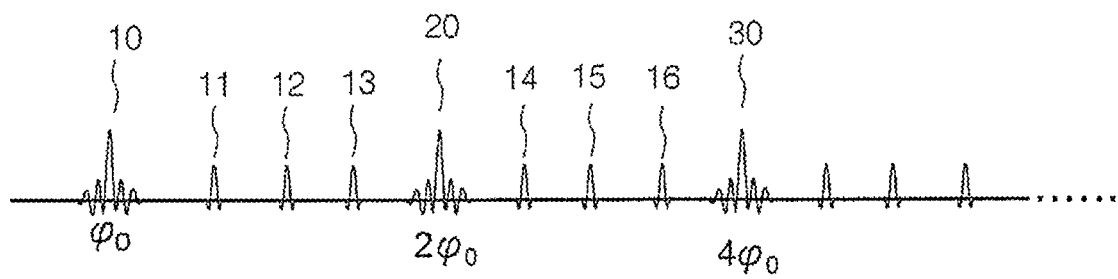
FIG. 3 schematically illustrates a phase diagram in a spatial saturation mode according to an embodiment of the present invention.

FIG. 3 is a phase diagram in a spatial saturation mode according to an embodiment of the present invention.

As shown in FIG. 3, 3 imaging sequence RF pulses are included between each pair of adjacent RF pulses of the spatial saturation module. For example, an RF pulse 11, an RF pulse 12 and an RF pulse 13 of the imaging sequence are included between an RF pulse 10 and an RF pulse 20 of the spatial saturation module. An RF pulse 14, an RF pulse 15 and an RF pulse 16 of the imaging sequence are included between the RF pulse 20 and an RF pulse 30 of the spatial saturation module. The RF pulse 10 is an initial RF pulse of the spatial saturation module; the RF pulse 11 is an initial RF pulse of the imaging sequence.

The phase of the RF pulse 10 is $\varphi_0$. The phases of the multiple RF pulses of the spatial saturation module are expressed by the formula $\varphi_j$: $\varphi_j = \frac{1}{2}\varphi_0(j^2+j+2)$, $j=0, 1, 2 \ldots$, wherein j are the respective order numbers of the RF pulses of the spatial saturation module, and $\varphi_0$ cannot divide exactly into 360 degrees.

Preferably, $\varphi_0$ is 117 degrees. When $\varphi_0$ is 117 degrees, $\varphi_1$ is 117 degrees×2=234 degrees, and $\varphi_2$ is 117 degrees×4=468 degrees. In other words, when the phase of the RF pulse 10 is 117 degrees, the phase of the RF pulse 20 is 234 degrees, and the phase of the RF pulse 30 is 468 degrees. By extension, the phases of all the RF pulses of the spatial saturation module can be obtained.

The phase of the RF pulse 11 is $\Phi_0$. The phases of the RF pulses of the imaging sequence are expressed by the formula $\Phi_k$: $\Phi_k = \frac{1}{2}\Phi_0(k^2+k+2)$, $k=0, 1, 2 \ldots$, wherein k are the respective order numbers of the RF pulses of the imaging sequence. Similarly, $\Phi_0$ cannot divide exactly into 360 degrees.

Preferably, $\Phi_0$ is 50 degrees. When $\Phi_0$ is 50 degrees, $\Phi_1$ is 100 degrees; $\Phi_2$ is 200 degrees; $\Phi_3$ is 350 degrees; $\Phi_4$ is 550 degrees. In other words, the phase of the RF pulse 11 is 50 degrees; the phase of the RF pulse 12 is 100 degrees; the phase of the RF pulse 13 is 200 degrees; the phase of the RF pulse 14 is 350 degrees; the phase of the RF pulse 15 is 550 degrees. By extension, the phases of all the RF pulses of the imaging sequence can be obtained.

Based on the abovementioned phase settings, a phase cycle mechanism independent of the imaging sequence is introduced for the spatial saturation module, and coherence of residual signals in the transverse plane can be destroyed more effectively, thereby reducing artefacts, and improving image quality. Moreover, a phase increase amount of two adjacent RF pulses of the spatial saturation module maintains linear increase, uniform dispersion of residual signals in the transverse plane can be ensured, and so artefact accumulation can also be prevented.

As an example, the difference in imaging results between an embodiment of the present invention and the prior art is verified using a T1-weighted FLASH protocol for neck soft tissue.

Figure 4A:
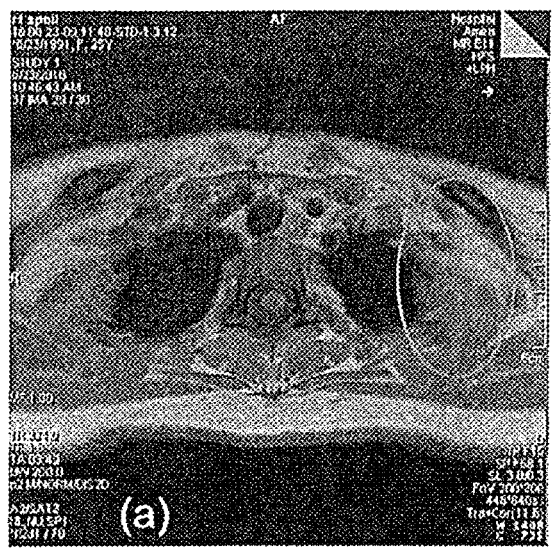
FIG. 4a is an example of an image acquired using a FLASH sequence in the prior art.
Figure 4B:
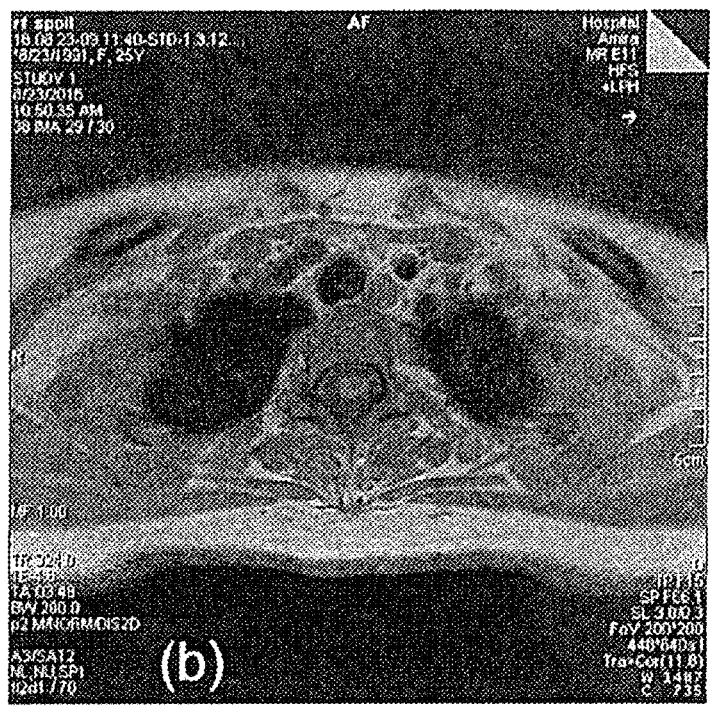
FIG. 4b is an example of an image acquired using a FLASH sequence in an embodiment of the present invention.

FIG. 4a shows an example of an image acquired using a FLASH sequence in the prior art. FIG. 4b shows an example of an image acquired using a FLASH sequence in an embodiment of the present invention. In a FLASH scan protocol, there are two rapid saturation bands parallel to the scanning slice, for suppressing a signal of blood flowing into the scanning slice. FIG. 4a is an image of one of the slices; an image artefact caused by a residual signal that has not been completely destroyed can be found in the circle. In FIG. 4b, no obvious artefact can be found. As can be seen, the embodiments of the present invention significantly reduce the artefact, and improve image quality.

Figure 5:
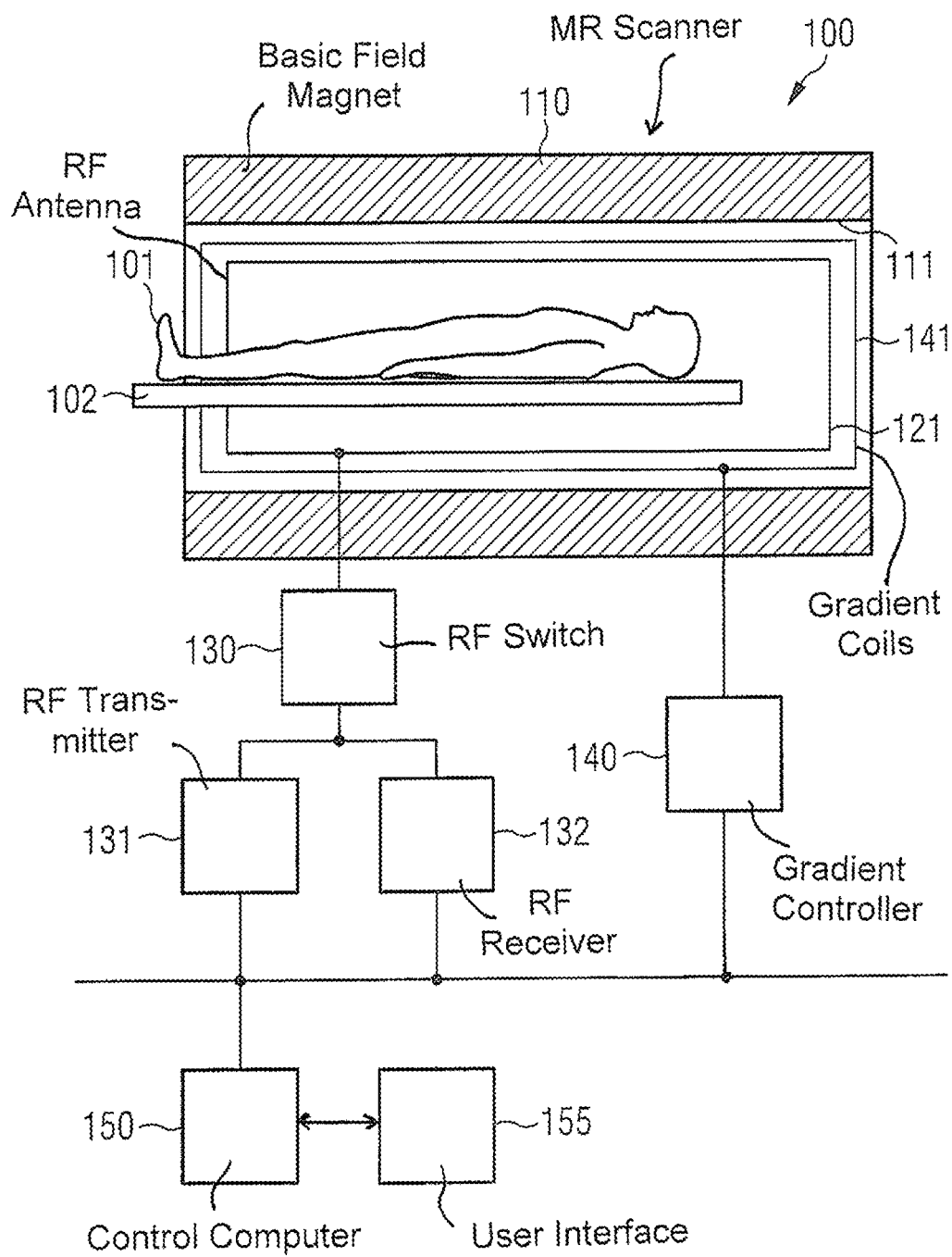
FIG. 5 schematically illustrates a magnetic resonance apparatus constructed and operating in accordance with the present invention.

FIG. 5 shows a magnetic resonance apparatus that implements the steps according to the invention, as described above. The apparatus has an MR scanner 100, with a basic field magnet 110 that generates a basic magnetic field in a patient receptacle 111, into which a patient 101 can be moved on a patient table 102.

The MR scanner 100 also has an RF antenna 121 and gradient coils 141. The RF antenna 121 is operated by an RF transmitter 131 in order to radiate RF pulses in accordance with the invention as described above. The RF transmitter 131 operates together with a gradient controller 140, in order to operate the MR scanner 100 so as to execute the MR image data acquisition sequences as described above. Switching between transmission mode and reception mode takes place via an RF switch 130. A control computer 150 is configured (programmed) to operate all of the aforementioned components so as to implement the embodiments of the invention as described above. The control computer 150 has a user interface 155, which includes input components such as a mouse, and display components such as a display monitor with a display screen on which control information, as well as reconstructed images, are displayed.

The raw MR data acquired in accordance with the embodiments of the method as described above are entered into a memory of the computer 150, as k-space data, from which image data are reconstructed in a known manner. Either the raw data in the memory, or the image data, can be made available from the computer 150 in electronic form, as one or more data files.

In an embodiment wherein multiple RF pulses are emitted, the phases of the multiple RF pulses of the spatial saturation module are $\varphi_j$: $\varphi_j = \frac{1}{2}\varphi_0(j^2+j+2)$, $j=0, 1, 2 \ldots$, wherein j are the respective order numbers of the multiple RF pulses; $\varphi_0$ is a phase of an initial RF pulse of the spatial saturation module.

The RF spoiling method for rapid spatial saturation proposed in an embodiment of the present invention may be written in the form of a plug-in program installed in an magnetic resonance imaging main control unit, a personal computer or a mobile terminal, etc., using an application program interface complying with a given standard, or may be packaged as an application program for a user to download and use.

The RF spoiling method for rapid spatial saturation proposed in an embodiment of the present invention may be stored on various storage media by instruction or instruction set storage. These storage media include but are not limited to: floppy disk, optical disk, DVD, hard disk, flash memory, etc.

Furthermore, the RF spoiling method for rapid spatial saturation proposed in an embodiment of the present invention may also be applied in storage media based on flash memory (Nand flash), such as USB stick, CF card, SD card, SDHC card, MMC card, SM card, memory stick, xD card, etc.

In summary, in an embodiment of the present invention, a first RF pulse of a spatial saturation module is applied, and after the first RF pulse, a first set of RF pulses of an imaging sequence is applied, wherein a phase of an RF pulse, closest to the first RF pulse in the time dimension, in the first set of RF pulses is not coherent with a phase of the first RF pulse. Thus, in accordance with the present invention, by making a phase cycle of the spatial saturation module and a phase cycle of the imaging sequence independent of each other, the coherence of residual signals in the transverse plane can be destroyed effectively, thereby reducing artefacts, and improving imaging quality.

Moreover, a phase increase amount of two adjacent RF pulses of the spatial saturation module in an embodiment of the present invention maintains linear increase, and uniform dispersion of residual signals in the transverse plane can be ensured, thereby preventing artefact accumulation. Furthermore, embodiments of the present invention do not require changes to hardware structure, and so are convenient to implement.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data by operation of an MR apparatus, comprising:
   providing control signals from a computer to an MR data acquisition scanner in order to cause the MR data acquisition scanner to execute a spatial saturation module comprising a first radio frequency (RF) pulse, a slice selection gradient and a dephasing gradient, while an examination subject is situated in the MR data acquisition scanner;
   from said computer, providing further control signals to said MR data acquisition scanner in order to cause said MR data acquisition scanner to execute an MR data acquisition sequence including radiating a first set of RF pulses after said first RF pulse of said spatial saturation module in order to acquire MR data from the examination subject;
   in said computer, setting a phase of an RF pulse in said first set of RF pulses, which is closest in time to said first RF pulse of said spatial saturation module, so as to not be coherent with a phase of said first RF pulse of said spatial saturation module; and
   via said computer, entering the acquired MR data into a memory, as k-space data, and making the k-space data available from said memory in electronic form, as a data file.

2. A method as claimed in claim 1 comprising:
   from said computer, providing control signals to said MR data acquisition scanner that cause said MR data acquisition scanner to radiate a second RF pulse in said spatial saturation module after said first set of RF pulses;
   from said computer, providing control signals to said MR data acquisition scanner to cause said MR data acquisition scanner to radiate a second set of RF pulses in said imaging sequence, after said second RF pulse of said spatial saturation module; and in said computer, setting a phase of an RF pulse in said second set of RF pulses, which is closest in time to said second RF pulse in said spatial saturation module, so as to not be coherent with a phase of the second RF pulse in said spatial saturation module.

3. A method as claimed in claim 2 comprising:
from said computer, providing control signals to said MR data acquisition scanner that cause said MR data acquisition scanner to radiate a third RF pulse in said spatial saturation module after said first set of RF pulses;
from said computer, providing control signals to said MR data acquisition scanner to cause said MR data acquisition scanner to radiate a third set of RF pulses in said imaging sequence, after said third RF pulse of said spatial saturation module; and
in said computer, setting a phase of an RF pulse in said third set of RF pulses, which is closest in time to said third RF pulse in said spatial saturation module, so as to not be coherent with a phase of the third RF pulse in said spatial saturation module.

4. A method for acquiring magnetic resonance (MR) data by operation of an MR apparatus, comprising:
providing control signals from a computer to an MR data acquisition scanner in order to cause the MR data acquisition scanner to execute a spatial saturation module comprising multiple radio frequency (RF) pulses, a slice selection gradient and a dephasing gradient, while an examination subject is situated in the MR data acquisition scanner;
from said computer, providing further control signals to said MR data acquisition scanner in order to cause said MR data acquisition scanner to execute an MR data acquisition sequence including radiating multiple RF pulses between an adjacent two of said RF pulses of said spatial saturation module in order to acquire MR data from the examination subject;
in said computer, setting a phase of each RF pulse in said multiple RF pulses of said spatial saturation module, so as to not be coherent with a phase of an RF pulse of said imaging sequence that is closest in time thereto; and
via said computer, entering the acquired MR data into a memory, as k-space data, and making the k-space data available from said memory in electronic form, as a data file.

5. A method as claimed in claim 4 comprising, from said computer, causing said MR data acquisition scanner to apply said spatial saturation module with two adjacent RF pulses of said spatial saturation module maintaining a linear phase increase therebetween, with a phase of an initial RF pulse of said spatial saturation module not dividing exactly into 360 degrees.

6. A method as claimed in claim 5 comprising, in said computer, setting respective phases of said multiple RF pulses as $\varphi_j$: $\varphi_j = \frac{1}{2}\varphi_0(j^2+j+2)$, $j=0, 1, 2 \ldots$, wherein j are respective order numbers of the multiple RF pulses, and $\varphi_0$ is the phase of the initial RF pulse of the spatial saturation module.

7. A method as claimed in claim 6 wherein $\varphi_0$ is 117 degrees, and wherein a phase of an initial RF pulse of said imaging sequence is 50 degrees.

8. A magnetic resonance (MR) apparatus comprising:
an MR data acquisition scanner;
a computer configured to provide control signals to said MR data acquisition scanner in order to cause the MR data acquisition scanner to execute a spatial saturation module comprising a first radio frequency (RF) pulse, a slice selection gradient and a dephasing gradient, while an examination subject is situated in the MR data acquisition scanner;
said computer being configured to provide further control signals to said MR data acquisition scanner in order to cause said MR data acquisition scanner to execute an MR data acquisition sequence including radiating a first set of RF pulses after said first RF pulse of said spatial saturation module in order to acquire MR data from the examination subject;
said computer being configured to set a phase of an RF pulse in said first set of RF pulses, which is closest in time to said first RF pulse of said spatial saturation module, so as to not be coherent with a phase of said first RF pulse of said spatial saturation module; and
said computer being configured to enter the acquired MR data into a memory, as k-space data, and making the k-space data available from said memory in electronic form, as a data file.

9. A magnetic resonance (MR) apparatus comprising:
an MR data acquisition scanner;
a computer configured to provide control signals to said MR data acquisition scanner in order to cause the MR data acquisition scanner to execute a spatial saturation module comprising multiple radio frequency (RF) pulses, a slice selection gradient and a dephasing gradient, while an examination subject is situated in the MR data acquisition scanner;
said computer being configured to provide further control signals to said MR data acquisition scanner in order to cause said MR data acquisition scanner to execute an MR data acquisition sequence including radiating multiple RF pulses between an adjacent two of said RF pulses of said spatial saturation module in order to acquire MR data from the examination subject;
said computer being configured to set a phase of each RF pulse in said multiple RF pulses of said spatial saturation module, so as to not be coherent with a phase of an RF pulse of said imaging sequence that is closest in time thereto; and
via said computer, entering the acquired MR data into a memory, as k-space data, and making the k-space data available from said memory in electronic form, as a data file.

10. An MR apparatus as claimed in claim 9 wherein said computer is configured to set respective phases of said multiple RF pulses as $\varphi_j = \frac{1}{2}\varphi_0(j^2+j+2)$, $j=0, 1, 2 \ldots$, wherein j are respective order numbers of the multiple RF pulses, and $\varphi_0$ is the phase of the initial RF pulse of the spatial saturation module.

* * * * *